United States Patent
Huang et al.

(10) Patent No.: US 10,068,984 B2
(45) Date of Patent: Sep. 4, 2018

(54) METHOD OF MANUFACTURING HIGH-K DIELECTRIC USING HFO/TI/HFO LAYERS

(71) Applicant: Taiwan Semiconductor Manufacturing Company, Ltd., Hsin-Chu (TW)

(72) Inventors: I-Chen Huang, Hsin-Chu (TW); Yi-Ju Hsu, Zhudong Township (TW); Chi-Wen Liu, Hsin-Chu (TW); Kuang-Hsin Chen, Jung-Li (TW); Yung-Hsien Wu, Hsin-Chu (TW); Chin-Yu Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/254,771

(22) Filed: Sep. 1, 2016

(65) Prior Publication Data
US 2017/0317182 A1   Nov. 2, 2017

Related U.S. Application Data

(60) Provisional application No. 62/328,461, filed on Apr. 27, 2016.

(51) Int. Cl.
| H01L 23/58 | (2006.01) |
| H01L 29/51 | (2006.01) |
| H01L 21/28 | (2006.01) |
| H01L 21/02 | (2006.01) |

(52) U.S. Cl.
CPC ........ *H01L 29/513* (2013.01); *H01L 21/0234* (2013.01); *H01L 21/02181* (2013.01); *H01L 21/02194* (2013.01); *H01L 21/02255* (2013.01); *H01L 21/02304* (2013.01); *H01L 21/28158* (2013.01); *H01L 29/517* (2013.01)

(58) Field of Classification Search
CPC ................. H01L 29/513; H01L 29/517; H01L 21/02181; H01L 21/02194; H01L 21/0234
See application file for complete search history.

(56) References Cited

U.S. PATENT DOCUMENTS

| 2006/0105530 | A1   | 5/2006  | Lai et al. |
| 2006/0270147 | A1   | 11/2006 | Ahn et al. |
| 2007/0128736 | A1 * | 6/2007  | Chang ............... H01L 21/28079 438/3 |
| 2008/0164539 | A1 * | 7/2008  | Collaert ............ H01L 21/28079 257/411 |
| 2015/0303057 | A1 * | 10/2015 | Lee .................... H01L 21/02181 257/410 |

\* cited by examiner

*Primary Examiner* — Matthew Gordon
(74) *Attorney, Agent, or Firm* — Slater Matsil, LLP

(57) ABSTRACT

A semiconductor device and method of manufacturing same are described. A first hafnium oxide (HfO$_2$) layer is formed on a substrate. A titanium (Ti) layer is formed over the first hafnium oxide layer. A second hafnium oxide layer is formed over the titanium layer. The composite device structure is thermally annealed to produce a high-k dielectric structure having a hafnium titanium oxide (Hf$_x$Ti$_{1-x}$O$_2$) layer interposed between the first hafnium oxide layer and the second hafnium oxide layer.

19 Claims, 9 Drawing Sheets

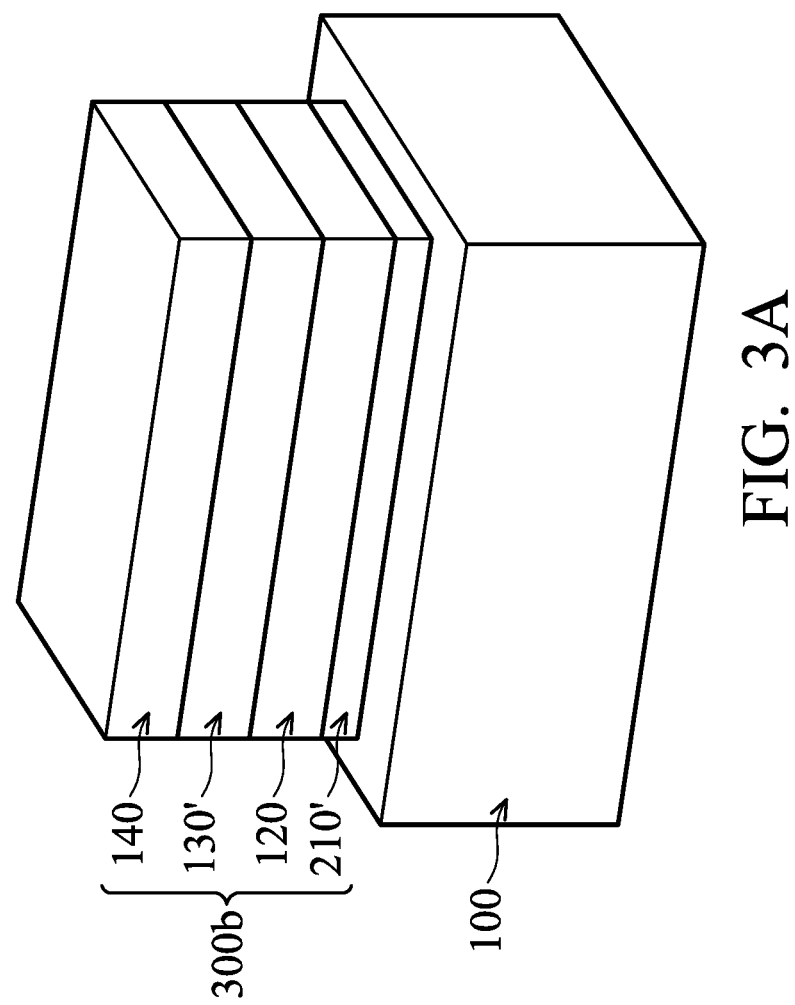

METHOD OF MANUFACTURING HIGH-K DIELECTRIC USING HFO/TI/HFO LAYERS

RELATED APPLICATIONS

This application claims the benefit of U.S. Provisional Application No. 62/328,461 filed on Apr. 27, 2016, entitled "High-K Dielectric and Method of Manufacture," which application is hereby incorporated herein by reference.

BACKGROUND

With the scaling of integrated circuits, device applications have employed increasingly rapid speeds of operation. This places faster switching requirements on metal-oxide-semiconductor (MOS) devices. MOS field-effect transistors (MOSFETs) with thin silicon dioxide gate dielectric layers may demonstrate unacceptable gate leakage currents. High dielectric constants (k-values) for gate dielectrics are desirable for reducing gate leakage currents and increasing the switching speed of MOS devices. Where transition oxides have been used between a substrate and a high-k dielectric layer, the resulting film may exhibit an unreliable voltage threshold ($V_t$) when subjected to an applied field. Since conventional silicon oxide, which has a k value of about 3.9, cannot satisfy such requirements, high-k dielectric materials have been increasingly used.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

FIG. 3A representatively illustrates a high-k dielectric device structure formed from the precursor structure of FIG. 2, in accordance with an embodiment.

DETAILED DESCRIPTION

Figure 1:
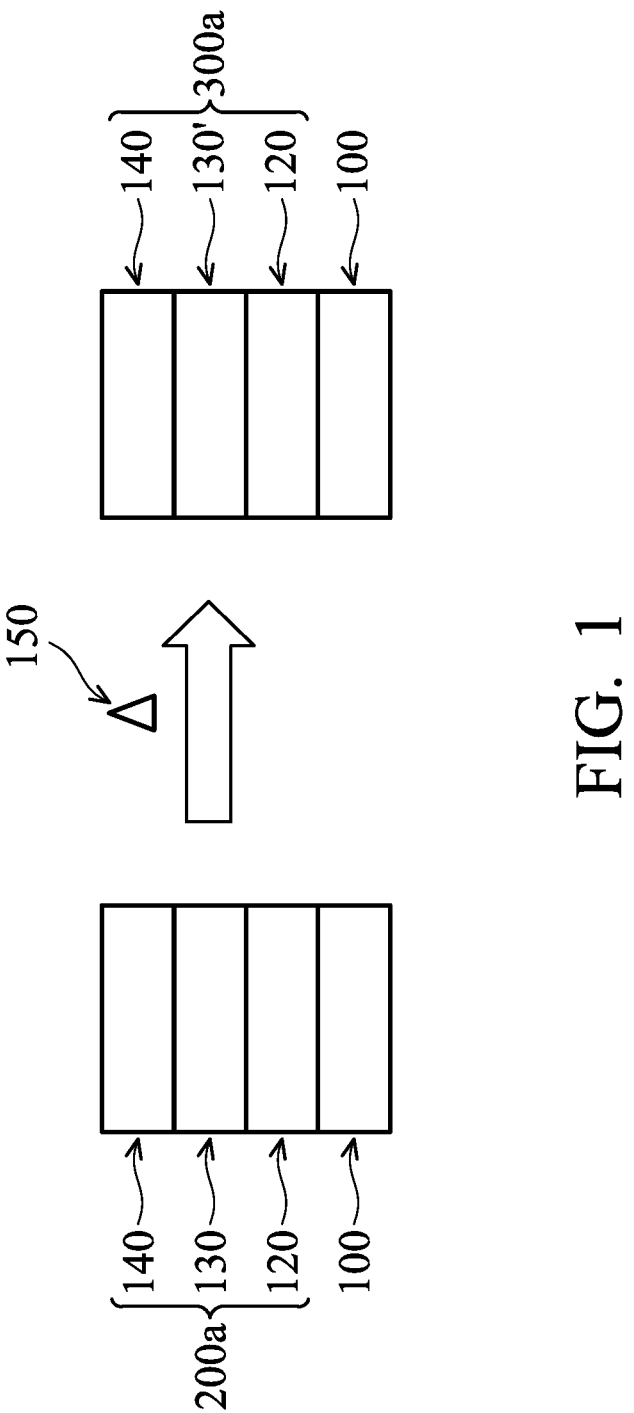
FIG. 1 representatively illustrates formation of a high-k dielectric device structure, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element's or feature's relationship to another element(s) or feature(s) as illustrated in the figures. The spatially relative terms are intended to encompass different orientations of the device in use or operation, in addition to the orientation depicted in the figures. The apparatus may be otherwise oriented (e.g., rotated 90 degrees or at other orientations) and the spatially relative descriptors used herein may likewise be interpreted accordingly.

Representative embodiments will be described with respect to a specific context; namely, a high-k gate dielectric structure in a metal-oxide semiconductor field effect transistor (MOSFET). The features disclosed herein, however, may be applied to various other devices and/or applications that may benefit, or be adapted to benefit, from use of a high-k dielectric structure.

As representatively illustrated in FIG. 1, a high-k dielectric device structure 300a may be formed from a precursor structure 200a comprising a first metal oxide layer 120 over a substrate 100, a metal layer 130 over the first metal oxide layer 120, and a second metal oxide layer 140 over the metal layer 130. In a representative embodiment, substrate 100 may comprise a silicon substrate. In other embodiments, substrate 100 may comprise one or more other suitable elemental semiconductors (e.g., diamond or germanium), a suitable compound semiconductor (e.g., gallium arsenide, silicon carbide, indium arsenide, or indium phosphide), or a suitable alloy semiconductor (e.g., silicon germanium carbide, gallium arsenic phosphide, or gallium indium phosphide). Substrate 100 may further comprise other features, such as various doped regions, a buried layer, an epitaxy layer, and/or insulating regions. Substrate 100 may be a silicon on insulator (SOI) or silicon on sapphire. In some embodiments, substrate 100 may comprise a doped epitaxial layer, a gradient semiconductor layer, and/or may further include a semiconductor layer overlying another semiconductor layer of a different type, such as a silicon layer on a silicon germanium layer. In other examples, a compound semiconductor substrate may comprise a multilayer silicon structure, or a silicon substrate may include a multilayer compound semiconductor structure.

In accordance with various representative embodiments, substrate 100 may be configured with shallow trench isolations (STIs) formed therein (not shown in the Figures). STIs are generally formed by etching a substrate to produce a trench, and filling the trench with a dielectric material, as is known in the art. The STIs may be filled with a dielectric material, such as, e.g., an oxide material, a high-density plasma (HDP) oxide, or the like.

An optional base oxide layer may be formed over substrate 100 by submerging substrate 100 in a solution containing de-ionized water and ozone ($DiO_3$ solution). The $DiO_3$ solution may be ultra-diluted, containing an ozone concentration of between about 1 part per million (ppm) and about 100 ppm, or between about 1 ppm and about 10 ppm. The oxidation may be performed at room temperature (e.g., about 25° C.). Higher or lower temperatures may be alternatively used. Processing time for formation of the optional base oxide layer may be from about 10 seconds to about 30 seconds.

A base oxide layer may have a thickness of less than about 10 Å, or between about 5 Å to about 7 Å. The thickness of the base oxide layer may be modified by adjusting process conditions, such as time, temperature, and/or the like. For a given process time, the thickness of the base oxide layer may be affected by the process temperature—a lower temperature tending to engage slower oxide formation with attendant production of relatively thin oxide thickness. High-k dielectric device structure 330a/300b may be formed with an optional base oxide layer over substrate 100.

In a representative embodiment, the thickness of high-k dielectric device structure 300b can be about 90 Å or less, or about 70 Å or less, or about 50 Å or less, or about 30 Å or less, or about 9 Å or less without causing significant leakage current. It should be appreciated that high-k dielectric device structure 300b may have a thickness of greater than about 9 Å, or less than about 90 Å.

In a representative embodiment, first metal oxide layer 120 and second metal oxide layer 140 may comprise hafnium oxide ($HfO_2$, k-value of about 25). In accordance with other embodiments, first metal oxide layer 120 and/or second metal oxide layer 140 may alternatively or conjunctively comprise one or more other metal oxides, such as, e.g., lanthanum oxide, barium oxide, zirconium oxide, tantalum oxide, strontium oxide, aluminum oxide, titanium oxide ($TiO_2$, k-value of about 50), or yttrium oxide. First metal oxide layer 120 and second metal oxide layer 140 may be deposited by any method known in the art. For example, in a representative embodiment, first metal oxide layer 120 and second metal oxide layer 140 may be deposited with atomic layer deposition (ALD). In various other embodiments, first metal oxide layer 120 and second metal oxide layer 140 may be deposited with chemical vapor deposition (CVD), plasma enhanced CVD (PECVD), high-density plasma CVD (HDPCVD), physical vapor deposition (PVD), and/or the like. Other commonly used methods, such as, e.g., low-pressure chemical vapor deposition (LPCVD), metal-organic chemical vapor deposition (MOCVD), plasma enhanced atomic layer deposition (PEALD), and the like, may be alternatively, conjunctively, or sequentially employed. The deposition thickness of first metal oxide layer 120 may be between about 3 Å and about 30 Å. The deposition thickness of second metal oxide layer 140 may be between about 3 Å and about 30 Å.

In a representative embodiment, metal layer 130 may comprise titanium. In accordance with other embodiments, metal layer 130 may alternatively or conjunctively comprise one or more other metals (e.g., hafnium, zirconium, and/or the like). Metal layer 130 may be deposited by any method known in the art. For example, in a representative embodiment, metal layer 130 may be deposited with ALD using $HfCl_4$, $TiCl_4$, or $ZrCl_4$ as precursors with water vapor. In various other embodiments, metal layer 130 may be deposited with CVD, PECVD, HDPCVD, PVD, and/or the like. The deposition thickness of metal layer 130 may be between about 3 Å and about 30 Å.

In accordance with an embodiment, utilization of an interfacial layer 210 (as representatively illustrated in FIG. 2) may be suitably adapted to improve the quality of subsequent deposition and adhesion of first metal oxide layer 120 to substrate 100. In such an embodiment, substrate 100 may be pre-cleaned with subsequent formation of interfacial layer 210 over cleaned substrate 100. In a representative aspect, interfacial layer 210 may comprise $SiO_2$ (k-value of about 3.9). In other embodiments, interfacial layer 210 may comprise a deposition of a metal silicate oxide, such as $HfSiO_x$. Interfacial layer 210 may be deposited by any method known in the art. For example, in various representative embodiments, interfacial layer 210 may be deposited with ALD, CVD, PECVD, HDPCVD, PVD, and/or the like.

In a representative embodiment, substrate 100 may physically contact first metal oxide layer 120, first metal oxide layer 120 may physically contact metal layer 130, and metal layer 130 may physically contact second metal oxide layer 140 to form precursor laminate structure 200a over substrate 100. In another representative embodiment, substrate 100 may physically contact an interfacial layer 210, the interfacial layer 210 may physically contact first metal oxide layer 120, first metal oxide layer 120 may physically contact metal layer 130, and metal layer 130 may physically contact second metal oxide layer 140 to form precursor laminate structure 200b over substrate 100, e.g., as representatively illustrated in FIG. 2.

As shown in FIG. 1, precursor structure 200a may be subjected to thermal annealing 150 to produce high-k dielectric device structure 300a (comprising high-k dielectric layer 130'). Thermal annealing 150 may be performed at a temperature of about 300° C. to about 1000° C. for a period of time between about 10 seconds and 15 minutes. If the precursor laminate structure 200b comprises $SiO_2$ as interfacial layer 210 (shown in FIG. 2), thermal annealing 150 may produce metal silicate interfacial layer 210' (shown in FIG. 3) by, e.g., thermal diffusion of metal from first metal oxide layer 120 into interfacial layer 210'. Alternatively, a metal silicate material may be deposited as interfacial layer 210 over substrate 100 prior to thermally annealing precursor structure 200b.

In a representative embodiment where first metal oxide layer 120 comprises hafnium oxide ($HfO_2$), metal layer 130 comprises titanium (Ti), and second metal oxide layer comprises hafnium oxide ($HfO_2$), thermal annealing 150 produces a high-k dielectric laminate structure 300a having a high-k dielectric layer 130' interposed between first metal oxide layer 120 and second metal oxide layer 140. In such an embodiment, high-k dielectric layer 130' may comprise hafnium titanium oxide ($Hf_xTi_{1-x}O_2$).

In some embodiments, a structure with a hafnium titanium oxide layer 130' disposed between first hafnium oxide layer 120 and second hafnium oxide layer 140 may comprise a composite high-k dielectric structure with a dielectric constant (k value) greater than a pre-determined value (e.g., greater than about 2.5, greater than about 3.0, greater than about 3.5, greater than about 3.9, etc.) In accordance with an embodiment, hafnium titanium oxide layer 130' may be configured to provide improved processing latitude to achieve higher k-values, while maintaining or otherwise improving leakage current performance.

In accordance with a representative aspect, high-k dielectric device structures comprising $Hf_xTi_{1-x}O_2$ material interposed between $HfO_2$ layers may have a height between about 5 Å and about 100 Å. In accordance with another representative aspect, hafnium titanium oxide ($Hf_xTi_{1-x}O_2$) material interposed between hafnium oxide ($HfO_2$) layers may be formed where titanium content can be modulated, or otherwise suitably selected, in order to control threshold voltage ($V_t$) of a nano-electronic device. The dual-sided character of the relative disposition of hafnium oxide layers provides further benefit for suppression of leakage current. In accordance with another representative aspect, $Hf_xTi_{1-x}O_2$ material interposed between first and second $HfO_2$ layers may be suitably adapted to prevent, or otherwise reduce, the formation of titanium silicate material at or near a layer interface boundary of the hafnium titanium oxide layer.

Figure 2:
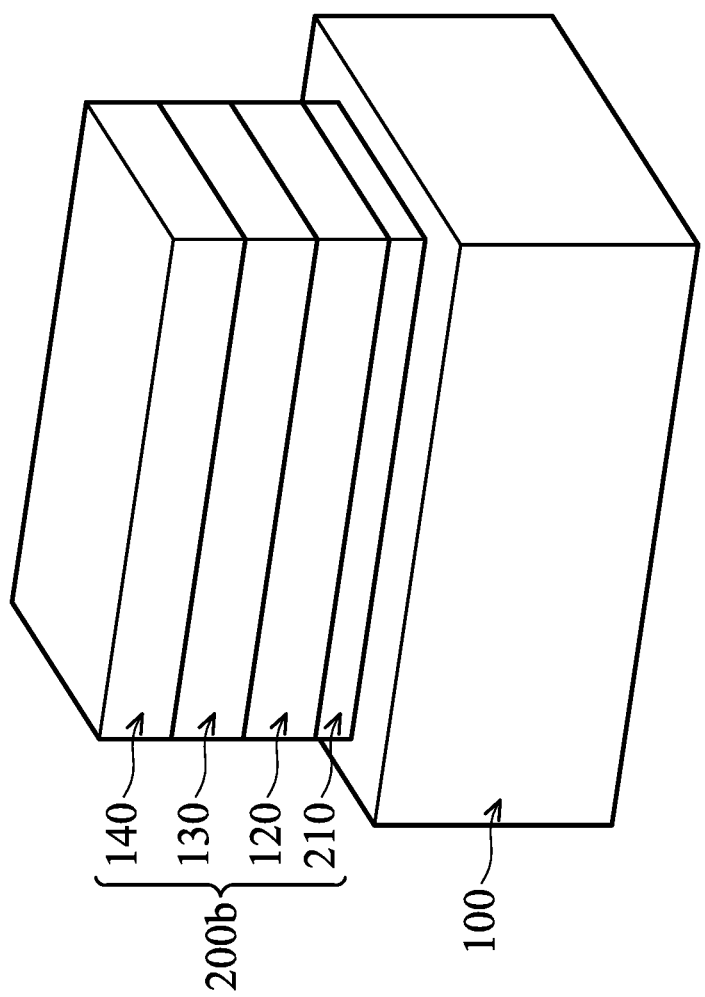
FIG. 2 representatively illustrates a precursor structure for forming a high-k dielectric device structure, in accordance with an embodiment.

In accordance with an embodiment as representatively illustrated in FIG. 2, a metal oxide silicate interfacial layer 210 may be formed over a pre-cleaned substrate. Interfacial layer 210 may comprise, e.g., hafnium oxide silicate. In other representative embodiments, interfacial layer 210 may comprise any metal oxide silicate material (e.g., an oxide silicate material based on La, Ba, Zr, Ta, Sr, Al, Ti, and/or Y). Interfacial layer 210 may be deposited with any deposition technique known in the art. For example, interfacial layer 210 may be deposited with ALD. In various other embodiments, interfacial layer 210 may be deposited with chemical vapor deposition (CVD), plasma enhanced CVD (PECVD), high-density plasma CVD (HDPCVD), physical vapor deposition (PVD), and/or the like. Thereafter, first metal oxide layer 120 may be deposited over interfacial layer 210, metal layer 130 may be deposited over first metal oxide layer 120, and second metal oxide layer 140 may be deposited over metal layer 130. The resulting composite structure corresponds to precursor laminate structure 200b.

In accordance with a representative aspect, the barrier height for a hafnium titanium oxide layer interposed between first and second hafnium oxide layers may be adjusted, e.g., by controlling titanium concentration during formation of titanium layer 130 to extend process flexibility. In a representative embodiment, precursor structure 200b may be subjected to thermal annealing to promote formation (e.g., via thermally induced diffusion) of hafnium titanium oxide layer 130' interposed between first hafnium oxide layer 120 and second hafnium oxide layer 140. FIG. 3 depicts a high-k dielectric device structure 300b produced after thermal annealing of precursor structure 200b.

In accordance with another representative aspect, post-deposition treatment of high-k dielectric device structure 300b with nitrogen (or, e.g., oxygen or fluorine) gas/plasma may be employed to passivate grain-boundary-induced defects, and further improve leakage current performance. High-k dielectric device structure 300b may be treated, e.g., with a nitrogen-containing plasma comprising ammonia mixed with nitrogen gas at a temperature of at least about 800° C. and a pressure of about 10 Torr to about 300 Torr. Nitridation (or oxygenation, or fluorination) reduces the number of dangling bonds that are located on the exposed surface of the second hafnium oxide layer 140. With reduction of these dangling bonds, fewer atoms of second hafnium oxide layer 140 will react and bond with overlying material of the gate electrode, thereby reducing the Fermi-level pinning that would otherwise occur absent nitridation (or oxygenation, or fluorination) treatment. Additionally, there will be a reduced shortage of oxygen bonds at the interface, thereby further reducing Fermi-level pinning.

Figure 3B:
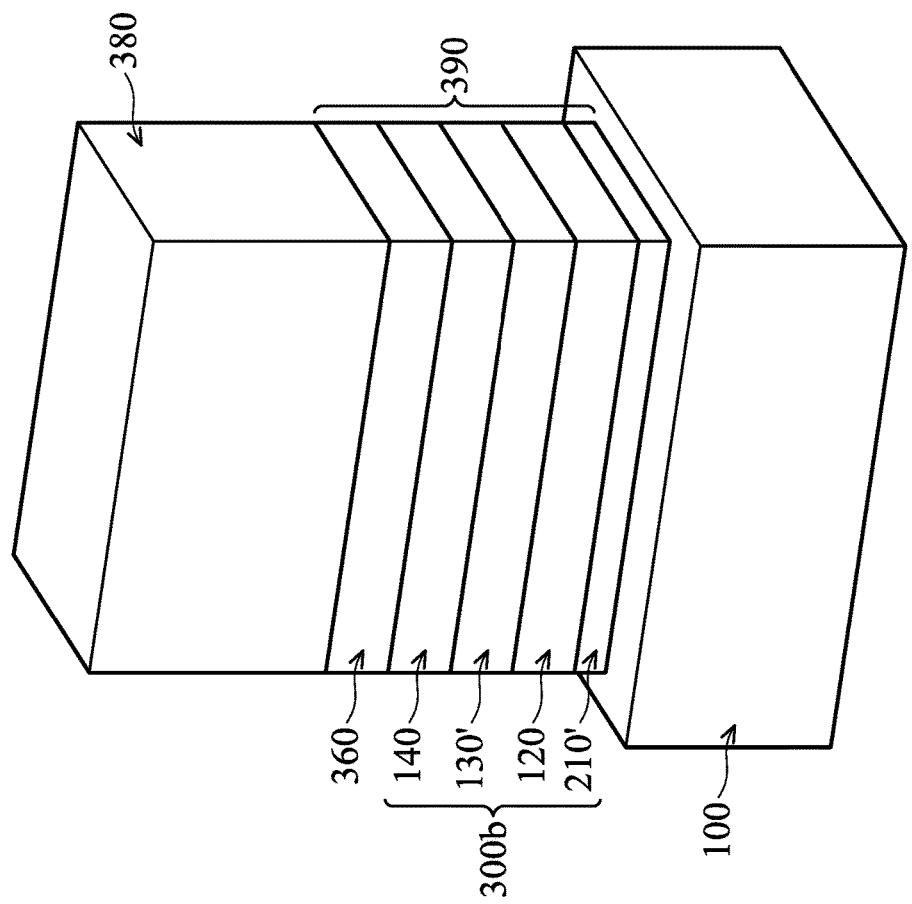
FIG. 3B representatively illustrates a high-k dielectric device structure formed from the precursor structure of FIG. 2, in accordance with another embodiment.
Figure 4A:
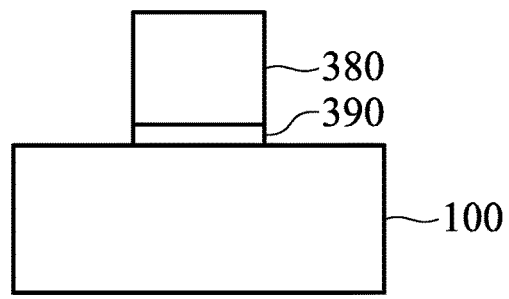
FIG. 4A is a cross-sectional view and FIG. 4B is a three-quarter isometric view both representatively illustrating a high-k dielectric device structure in accordance with an embodiment.
Figure 4B:
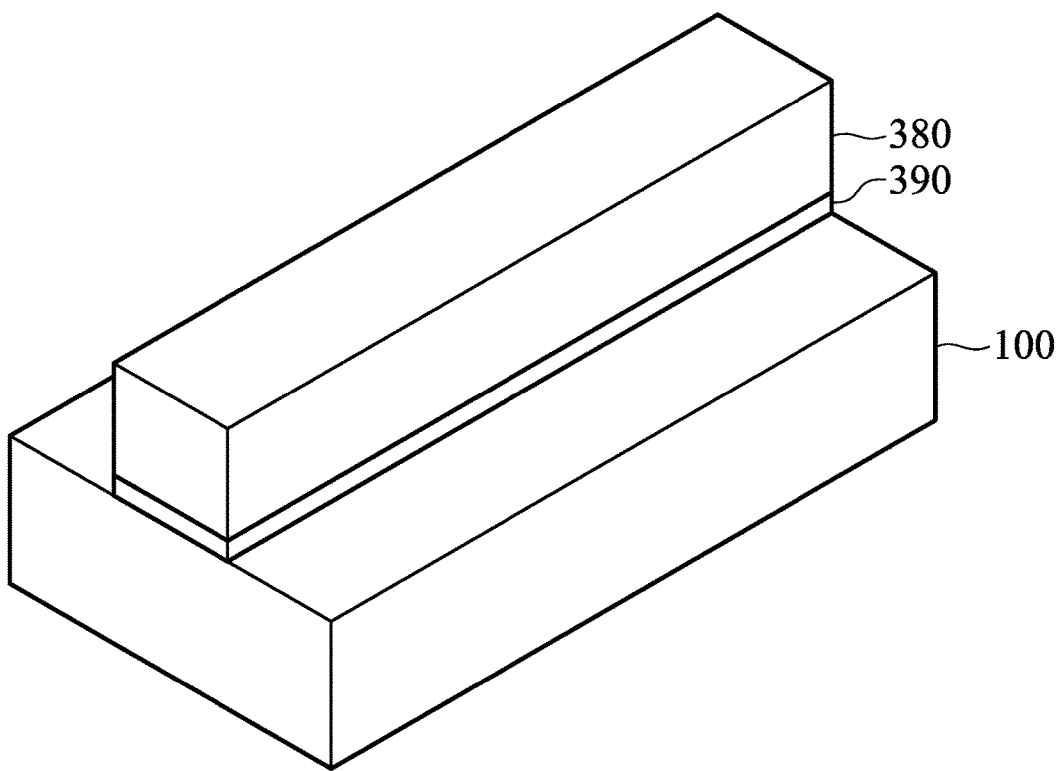
Figure 5A:
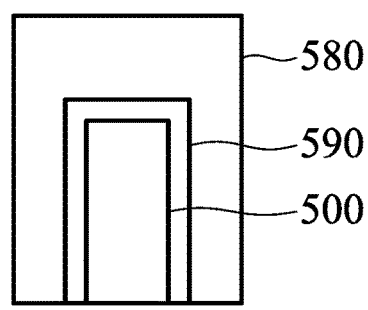
FIG. 5A is a cross-sectional view and FIG. 5B is a three-quarter isometric view both representatively illustrating a high-k dielectric device structure in accordance with another embodiment.
Figure 5B:
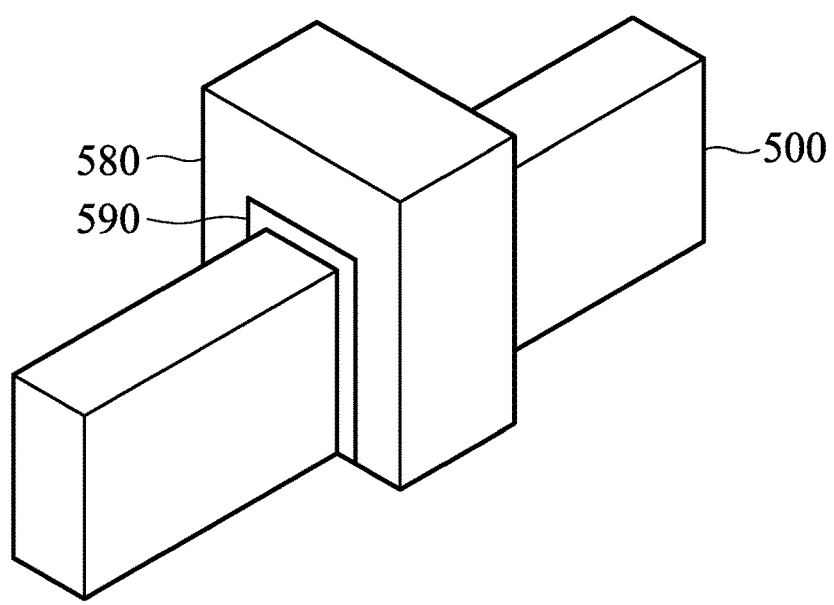
Figure 6A:
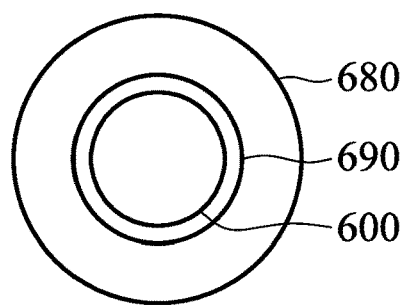
FIG. 6A is a cross-sectional view and FIG. 6B is a three-quarter isometric view both representatively illustrating a high-k dielectric device structure in accordance with yet another embodiment.
Figure 6B:
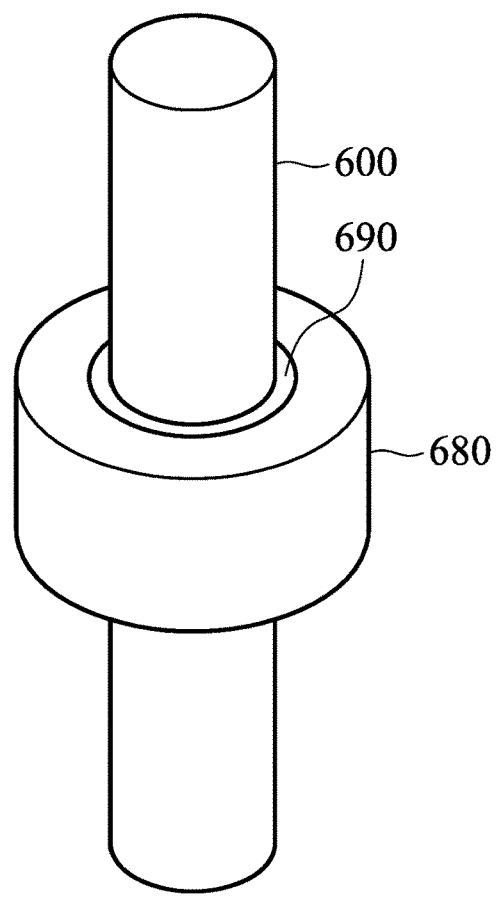

FIGS. 3B, 4A, and 4B generally illustrate a substantially monolithic gate structure 380 formed over substrate 100 with laminated high-k dielectric structure 390 disposed therebetween, in accordance with a planar transistor embodiment. Alternatively, as representatively illustrated in FIGS. 5A and 5B, U-shaped gate structure 580 may be formed over U-shaped laminated high-k dielectric structure 590 and fin portion of substrate 500, in accordance with a fin field-effect transistor (FinFET) embodiment. Alternatively, as representatively illustrated in FIGS. 6A and 6B, ring-shaped gate structure 680 may be formed over ring-shaped laminated high-k dielectric structure 690 and cylinder portion of substrate 600, in accordance with, e.g., a gate-all-around (GAA) embodiment. It will be appreciated, however, that other source/drain and gate structures, geometries, or shapes may be alternatively or conjunctively employed in accordance with various other embodiments.

Figure 7:
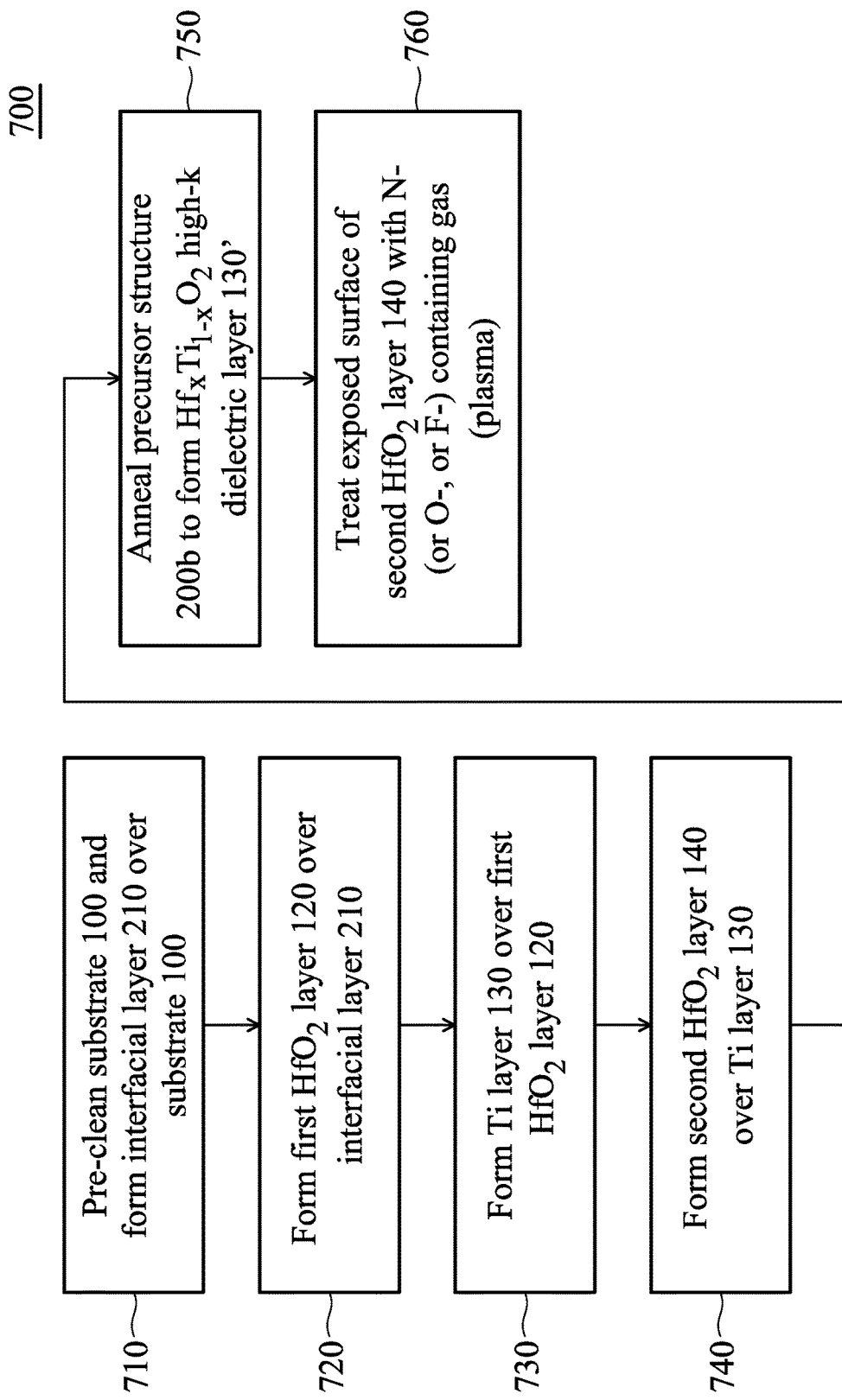
FIG. 7 representatively illustrates a method of forming a high-k dielectric device structure, in accordance with an embodiment.

As representatively illustrated in FIG. 7, a method 700 of forming a high-k dielectric device structure (e.g., a gate dielectric of a MOSFET) comprises a first step 710 of pre-cleaning substrate 100 and forming interfacial layer 210 over substrate 100, a second step 720 of forming first hafnium oxide layer 120 over interfacial layer 210, a third step 730 of forming a titanium layer 130 over first hafnium oxide layer 120, a fourth step 740 of forming second hafnium oxide layer 140 over titanium layer 130, a fifth step 750 of annealing the composite precursor structure 200b to form hafnium titanium oxide high-k dielectric layer 130', and a sixth step 760 of treating high-k dielectric device structure 300b with nitrogen-, oxygen-, or fluorine-containing plasma to densify and passivate the exposed surface of second hafnium oxide layer 140.

A gate electrode layer may be formed over the second metal oxide layer 140. The gate electrode layer may comprise a conductive material, such as polysilicon, a metal (e.g., tantalum, titanium, molybdenum, tungsten, platinum, aluminum, hafnium, ruthenium, copper, cobalt, and/or the like), a metal silicide (e.g., titanium silicide, cobalt silicide, nickel silicide, tantalum silicide, and/or the like), a metal nitride (e.g., titanium nitride, tantalum nitride, and/or the like), a metal carbide (e.g., titanium carbide, tungsten carbide, and/or the like), doped poly-crystalline silicon, other conductive materials, or a combination thereof. The gate electrode layer may be formed to have a thickness in the range of about 100 Å to about 2,500 Å, or about 600 Å. One or more barrier layer(s) and/or work function metal(s) may be included as suitably configured, or otherwise adapted, for NMOS or PMOS processing.

The process used to form the gate electrode layer may be controlled so that the oxygen-hafnium-oxide material bonds (if the second hafnium oxide layer 140 is oxidized) or the nitrogen-hafnium-oxide material bonds (if the second hafnium oxide layer 140 is nitridized) are not broken. If these bonds are broken during formation of the gate electrode layer, material of the second hafnium oxide layer 140 could then bond with atoms from the gate electrode layer.

In accordance with a representative embodiment, the gate electrode layer may comprise polysilicon formed through physical vapor deposition (PVD) to avoid the harsh reducing environments typically associated with other methods that may break bonds formed during nitridation or oxidation processes, leaving the material in the second hafnium oxide layer 140 substantially free to bond with the deposited gate electrode layer. PVD, without as harsh a reducing environment, will not substantially break these bonds, and the bonding structures discussed above will therefore remain substantially intact.

Notwithstanding the preceding, PVD is not the only method that may be used to form the gate electrode layer and still retain at least some of the beneficial properties of the present disclosure. Other methods, such as CVD or LPCVD, could be alternatively or conjunctively used if the process parameters are chosen so as not to remove a substantial portion of the oxygen or nitrogen bonded to the material of second hafnium oxide layer 140. For example, during CVD, the process temperature may be adapted to remain below about 580° C. in order to avoid breaking bonds.

A gate stack may be formed from the gate electrode layer 380 (e.g., comprising titanium, aluminum, copper, tantalum, cobalt, nitrogen, carbon, tungsten, silicon, and/or the like), an adhesion layer 360 (e.g., comprising titanium, aluminum, copper, tantalum, cobalt, nickel, tungsten, carbon, silicon, and/or the like), the high-k dielectric device structure 300*b*, and an optional base oxide layer. The high-k dielectric device structure 300*b* and adhesion layer 360 may form laminated high-k dielectric structure 390. A thermal anneal process diffuses elements from gate electrode layer 380 and adhesion layer 360 into high-k dielectric structure 300*b*. Accordingly, in a representative embodiment, titanium, aluminum, tantalum, cobalt, copper, carbon, nitrogen, silicon, and/or the like contributed from gate electrode layer 380 and/or adhesion layer 360 may exist in high-k dielectric structure 300*b* post-anneal. The weight/weight (wt/wt) percentage composition of titanium, aluminum, tantalum, cobalt, copper, carbon, nitrogen, silicon, and/or the like per unit volume of high-k dielectric structure 300*b* is generally less than 5% (wt/wt), as respectively contributed from gate electrode layer 380 and/or adhesion layer 360. Post-anneal, first metal oxide layer 120 may comprise: about 0.01% (wt/wt) to about 5% (wt/wt) titanium; about 0.01% (wt/wt) to about 0.5% (wt/wt) aluminum; about 0.01% (wt/wt) to about 1.0% (wt/wt) tantalum, cobalt, copper, carbon, or nitrogen; and/or about 0.01% (wt/wt) to about 2.0% (wt/wt) silicon as elements diffused from gate electrode layer 380 and/or adhesion layer 360. Post-anneal, high-k dielectric layer 130' may comprise: about 0.05% (wt/wt) to about 6% (wt/wt) titanium; about 0.01% (wt/wt) to about 0.5% (wt/wt) aluminum; about 0.01% (wt/wt) to about 1.0% (wt/wt) tantalum, cobalt, copper, carbon, or nitrogen; and/or about 0.01% (wt/wt) to about 2.0% (wt/wt) silicon as elements diffused from gate electrode layer 380 and/or adhesion layer 360. Post-anneal, second metal oxide layer 140 may comprise: about 0.1% (wt/wt) to about 10% (wt/wt) titanium; about 0.2% (wt/wt) to about 5.0% (wt/wt) aluminum; about 1.0% (wt/wt) to about 2.0% (wt/wt) tantalum, cobalt, copper, carbon, or nitrogen; and/or about 0.05% (wt/wt) to about 5.0% (wt/wt) silicon as elements diffused from gate electrode layer 380 and/or adhesion layer 360.

The gate stack may be formed by deposition and patterning of a photoresist layer over the gate electrode layer. Material not covered by the patterned photoresist layer may then be removed (e.g., with etching) until substrate 100 is substantially exposed.

Figure 8:
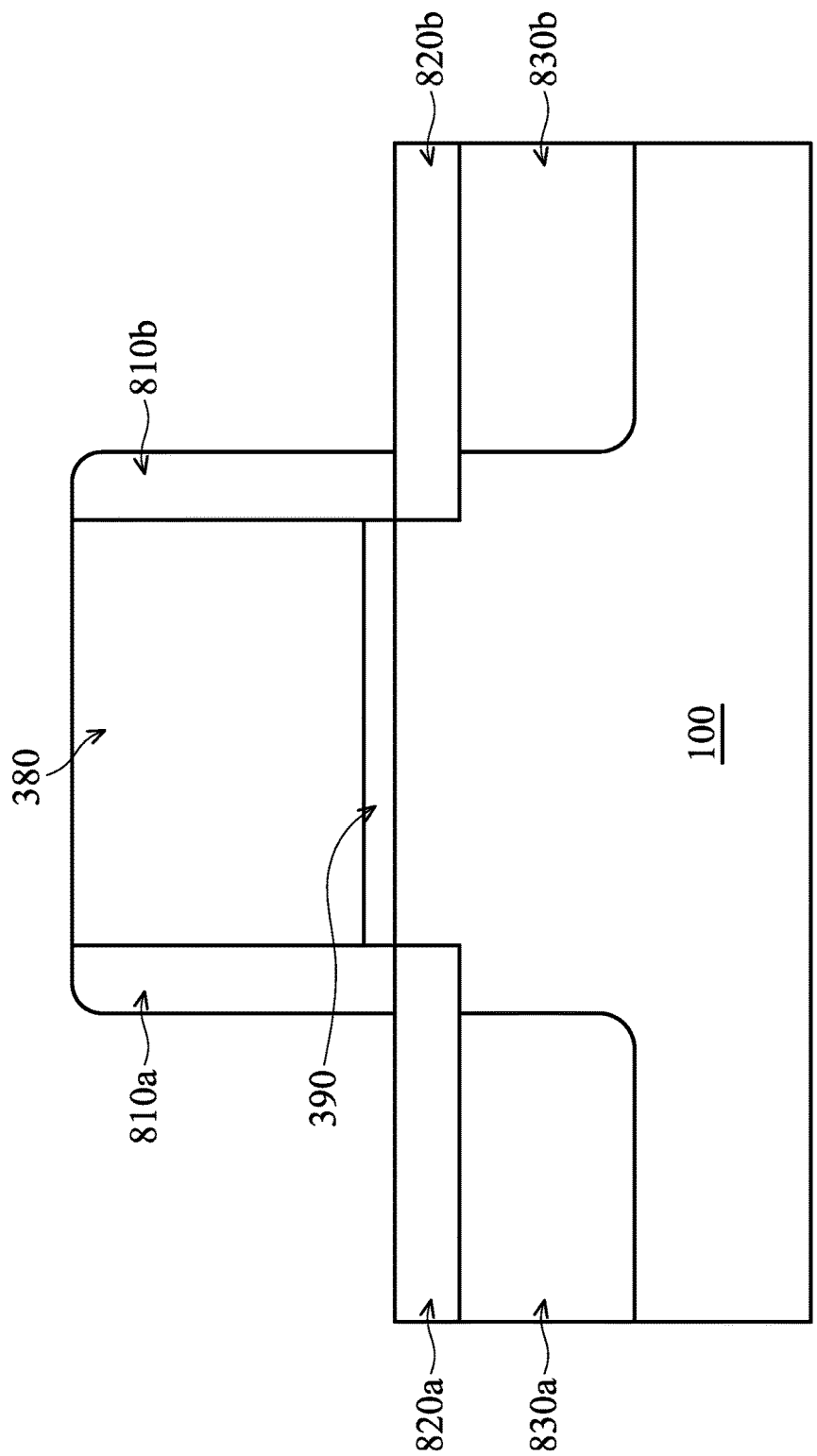
FIG. 8 representatively illustrates a metal-oxide semiconductor field effect transistor (MOSFET) with a gate dielectric comprising a high-k dielectric device structure, in accordance with an embodiment.

Spacers and source/drain regions may be formed to substantially complete fabrication of a functioning semiconductor device (e.g., a MOSFET, as representatively illustrated in FIG. 8). Spacers 810*a*, 810*b* may be formed on sidewalls of gate electrode 380. The spacers may be formed by blanket depositing a spacer layer on the immediately previous structure. The spacer layer may comprise SiN, oxynitride, SiC, SiON, an oxide material, and/or the like, and may be formed by commonly used methods, such as CVD, PECVD, sputter, and/or other methods known in the art. The spacer layer may be patterned to form the spacers, e.g., by anisotropically etching to remove the spacer layer from horizontal surfaces of the structure.

In an embodiment, substrate 100 may have a dummy gate stack formed thereon. The dummy gate stack may comprise a sacrificial structure used to align and form source/drain regions adjacent to the dummy gate stack—the dummy gate stack being replaced in subsequent processing steps. As such, the dummy gate stack may be formed of any suitable material using any suitable process. In some embodiments, the dummy gate stack may be formed substantially simultaneously as other devices on a wafer (e.g., other transistors). In such embodiments, it may be desirable to form the dummy gate stack from a dummy gate dielectric and a dummy gate electrode, which layers may be used to form functional gate stacks for other devices.

In a representative gate-last process, one or more spacers may be formed in accordance with an embodiment. The spacers may include first gate spacers and second gate spacers (collectively referred to as "spacers") along sidewalls of the dummy gate stack. The second gate spacers may also act as a contact etch stop layer (CESL) during formation of contacts through a subsequently formed interlayer dielectric film. The spacers may be etched to form a funnel-shaped opening during the removal of the dummy gate stack, thereby allowing an open-profile gate electrode. As such, in some embodiments, materials selected to form the spacers (e.g., the first gate spacers and the second gate spacers) may be selected to maintain an etch selectivity that results in a desired funnel shape.

In some embodiments, the first gate spacers may be formed from silicon oxide, and the second gate spacers may be formed from silicon nitride. The first gate spacers may be formed, e.g., by forming a conformal layer of silicon oxide and performing an anisotropic etch to remove the dielectric material other than that dielectric material adjacent the dummy gate stack. The second gate spacers may be formed, e.g., by depositing a conformal layer of silicon nitride. Some embodiments may incorporate silicide regions, buried stressors, recessed source/drain regions filled with a stressor, raised source/drain regions, different materials, different gate structures and/or materials, halo implants, different source/drain doping profiles, and/or the like.

Source/drain regions may be formed in the substrate on opposing sides of the gate stack. The source/drain regions may include any appropriate doping profile for a particular application. For example, the source/drain regions may include lightly-doped source/drain (LDD) regions 820*a*/820*b* formed by implanting dopants (e.g., n-type dopants or p-type dopants) using the dummy gate stack as a mask, thereby aligning the LDD regions 820*a*/820*b* with the edges of the dummy gate stack. Halo and/or pocket regions (not shown) may also be formed. The source/drain regions may further include highly-doped source/drain regions 830*a*/830*b* formed by implanting dopants (e.g., n-type dopants or p-type dopants) using the dummy gate stack and gate spacers as a mask.

In an embodiment in which the substrate is an n-type substrate, the source/drain regions may be formed by implanting suitable p-type dopants, such as boron, gallium, indium, and/or the like. These source/drain regions may be implanted using the gate stack and the gate spacers as masks. It should be noted that one of ordinary skill in the art will realize that many other processes, steps, or the like may be used to form source/drain regions. For example, a plurality of implants may be performed using various combinations of spacers and liners to form source/drain regions having a specific shape or characteristic suitably adapted for a particular purpose. Any such processes may be employed to form source/drain regions, and the above description is not limited to the steps recited.

A first inter-layer dielectric (ILD) layer may be formed in accordance with some embodiments. The first ILD layer may be formed, for example, of a low-k dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, CVD, PECVD, or the like. The first ILD layer may comprise a plurality of dielectric layers. The first ILD layer over the dummy gate stack may be removed to expose the dummy gate stack. In some embodiments, a chemical mechanical polishing (CMP) process may be used to planarize an upper surface of the first ILD layer to be substantially level with an upper surface of the dummy gate stack.

In embodiments where the dummy gate stack is a polysilicon material, the dummy gate stack may be selectively etched using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as nitrogen, oxygen, or argon may optionally be used. Where wet etching is used, representative etching chemicals may include $NH_4OH:H_2O_2:H_2O$ (APM), $NH_2OH$, KOH, $HNO_3:NH_4F:H_2O$, and/or the like.

A titanium oxide layer thickness of about 5.0 Å has a corresponding Equivalent Oxide Thickness (EOT) of about 2.2 Å. A titanium oxide layer thickness of about 11 Å has a corresponding EOT of about 1.8 Å. A titanium oxide layer thickness of about 13 Å has a corresponding EOT of about 1.6 Å.

An embodiment may comprise a method of manufacturing a semiconductor device that includes the steps of forming a first hafnium oxide layer over a substrate, forming a titanium layer over the first hafnium oxide layer, and forming a second hafnium oxide layer over the titanium layer. The method may further comprise the step of forming an interfacial layer interposed between the substrate and the first hafnium oxide layer. Formation of the interfacial layer may comprise pre-cleaning the substrate prior to depositing an interfacial material. The interfacial material may comprise a metal oxide silicate. The titanium layer may be configured to contact the first hafnium oxide layer and the second hafnium oxide layer. The method may further comprise the step of thermally annealing the first hafnium oxide layer, the titanium layer, and the second hafnium oxide layer to produce a high-k dielectric structure, wherein the high-k dielectric structure comprises hafnium titanium oxide. The hafnium titanium oxide may correspond to a high-k dielectric layer interposed between and contacting the first hafnium oxide layer and the second hafnium oxide layer. The method may further comprise the step of treating the high-k dielectric structure with at least one of a nitrogen-, oxygen-, or fluorine-containing gas to densify an exposed surface of the second hafnium oxide layer. Densifying treatment of the high-k dielectric structure may comprise a plasma treatment.

Another embodiment may comprise a method of fabricating a high-k dielectric structure comprising the step of forming a hafnium titanium oxide layer disposed between a first hafnium oxide layer and a second hafnium oxide layer. At least one of the first hafnium oxide layer or the second hafnium oxide layer may be formed by atomic layer deposition (ALD) of $HfO_2$. Formation of the hafnium titanium oxide layer may comprise a thermal treatment applied to a precursor device structure having a layer of titanium interposed between and contacting the first hafnium oxide layer and the second hafnium oxide layer, wherein the thermal treatment produces the hafnium titanium oxide layer. The precursor device structure may have a height of between about 5 Å and about 60 Å. The thermal treatment may comprise an annealing process.

In yet another embodiment, a high-k dielectric structure comprises a substrate, a first hafnium oxide layer over the substrate, a hafnium titanium oxide layer over the first hafnium oxide layer, and a second hafnium oxide layer over the hafnium titanium oxide layer. The high-k dielectric structure may further comprise an interfacial layer interposed between and contacting the substrate and the first hafnium oxide layer. The interfacial layer may comprise a metal oxide silicate. The hafnium titanium oxide layer may be configured to contact the first hafnium oxide layer and the second hafnium oxide layer. A height between the bottom surface of the first hafnium oxide layer and the top surface of the second hafnium oxide layer may be between about 5 Å and about 60 Å. In a representative embodiment, the height between the bottom surface of the first hafnium oxide layer and the top surface of the second hafnium oxide layer may be about 17 Å. The height between the bottom surface of the first hafnium oxide layer and the top surface of the second hafnium oxide layer may correspond to an equivalent oxide thickness of between 1.6 Å and about 2.2 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a silicon oxide layer over a substrate;
   forming a first hafnium oxide layer over the silicon oxide layer;
   forming a titanium layer over the first hafnium oxide layer;
   forming a second hafnium oxide layer over the titanium layer;
   performing a first thermal annealing on the silicon oxide layer, first hafnium oxide layer, the titanium layer, and the second hafnium oxide layer to produce a hafnium silicate layer and a high-k dielectric structure over the hafnium silicate layer, the high-k dielectric structure comprising a third hafnium oxide layer, a hafnium titanium oxide layer, and a fourth hafnium oxide layer, wherein the hafnium titanium oxide layer is interposed between the third hafnium oxide layer and the fourth hafnium oxide layer; and
   after performing the first thermal annealing, treating the high-k dielectric structure with at least one of a nitrogen-, oxygen-, or fluorine-containing gas to densify an exposed surface of the second hafnium oxide layer.

2. The method of claim 1, further comprising pre-cleaning the substrate prior to forming the silicon oxide layer.

3. The method of claim 1, wherein the titanium layer contacts the first hafnium oxide layer and the second hafnium oxide layer.

4. The method of claim 1, wherein the hafnium titanium oxide layer contacts the third hafnium oxide layer and the fourth hafnium oxide layer.

5. The method of claim 1, wherein the treating the high-k dielectric structure comprises a plasma treatment.

6. The method of claim 1, wherein the at least one of the nitrogen-, oxygen-, or fluorine-containing gas is a mixture of ammonia gas and nitrogen gas.

7. The method of claim 1, wherein the at least one of the nitrogen-, oxygen-, or fluorine-containing gas is an oxygen-containing gas.

8. A method of fabricating a high-k dielectric structure, the method comprising:
  forming a hafnium silicate layer;
  simultaneously with forming the hafnium silicate layer, forming a hafnium titanium oxide layer disposed between and contacting a first hafnium oxide layer and a second hafnium oxide layer, a surface of the second hafnium oxide layer being exposed;
  after forming the hafnium titanium oxide layer, reducing a number of dangling bonds on the surface of the second hafnium oxide layer by exposing the surface of the second hafnium oxide layer to a mixture of ammonia and nitrogen gas; and
  after reducing the number of dangling bonds, forming a conductive layer over the exposed surface of the second hafnium oxide layer.

9. The method of claim 8, wherein at least one of the first hafnium oxide layer or the second hafnium oxide layer are formed by atomic layer deposition (ALD) of $HfO_2$.

10. The method of claim 8, wherein forming the hafnium titanium oxide layer comprises a thermal treatment applied to a precursor device structure having a layer of titanium interposed between and contacting the first hafnium oxide layer and the second hafnium oxide layer, the thermal treatment producing the hafnium titanium oxide layer.

11. The method of claim 10, wherein the precursor device structure has a height of between about 5 Å and about 60 Å.

12. The method of claim 10, wherein the thermal treatment comprises annealing.

13. A method of manufacturing a semiconductor device, the method comprising:
  forming a silicon oxide layer over a semiconductor material;
  forming a first hafnium oxide layer over the silicon oxide layer;
  forming a titanium layer over the first hafnium oxide layer;
  forming a second hafnium oxide layer over the titanium layer;
  converting the silicon oxide layer to a hafnium silicate layer;
  converting the titanium layer into a hafnium titanium oxide layer interposed between remaining portions of the first hafnium oxide layer and the second hafnium oxide layer;
  after converting the silicon oxide layer and converting the titanium layer, attaching oxygen or nitrogen atoms to dangling bonds of an exposed surface of the second hafnium oxide layer; and
  forming a gate electrode over the second hafnium oxide layer.

14. The method of claim 13, wherein the first hafnium oxide layer, the titanium layer, and the second hafnium oxide layer are U-shaped.

15. The method of claim 13, wherein converting the silicon oxide layer and converting the titanium layer comprises annealing the first hafnium oxide layer, the titanium layer, and the second hafnium oxide layer to produce a high-k dielectric material.

16. The method of claim 13, wherein attaching oxygen or nitrogen atoms to dangling bonds is performed at least in part by exposing the second hafnium oxide layer to a nitrogen or oxygen gas.

17. The method of claim 1, wherein the at least one of the nitrogen-, oxygen-, or fluorine-containing gas is a nitrogen- or fluorine-containing gas.

18. The method of claim 8, wherein reducing the number of dangling bonds is performed at least in part by treating the high-k dielectric structure with at least one of a nitrogen, oxygen, or fluorine gas.

19. The method of claim 13, wherein attaching is performed at least part by exposing the exposed surface of the second hafnium oxide layer to a mixture of ammonia gas and nitrogen gas.

* * * * *